United States Patent

Tomi

[19]

[11] Patent Number: 5,877,620
[45] Date of Patent: Mar. 2, 1999

[54] METHOD AND SYSTEM FOR ANALYZING AND DISPLAYING WAVEFORM DATA

[75] Inventor: Takahisa Tomi, Tokyo, Japan

[73] Assignee: Advantest Corporation, Tokyo, Japan

[21] Appl. No.: 896,148

[22] Filed: Jul. 17, 1997

[30] Foreign Application Priority Data

Jul. 23, 1996 [JP] Japan .................................. 8-193340

[51] Int. Cl.⁶ .................................................. G01R 23/16
[52] U.S. Cl. ..................................... 324/76.12; 324/76.11; 702/67
[58] Field of Search ............................... 324/76.11, 76.12, 324/76.19; 364/487; 702/66, 67, 68, 69, 70

[56] References Cited

U.S. PATENT DOCUMENTS

| | | | |
|---|---|---|---|
| 4,072,851 | 2/1978 | Rose | 324/76.12 |
| 4,104,725 | 8/1978 | Rose et al. | 324/76.12 |
| 4,455,613 | 6/1984 | Shoemaker | 364/487 |
| 4,592,369 | 6/1986 | Davis et al. | 324/76.12 |
| 5,519,820 | 5/1996 | Kawauchi et al. | 324/76.11 |

*Primary Examiner*—Diep N. Do
*Attorney, Agent, or Firm*—Knobbe, Martens, Olson & Bear, LLP

[57] ABSTRACT

In a waveform analyzer directed toward enabling recognition at a glance whether displayed waveform data are within a desired range; waveform data converter 50 inputs waveform data stored in a waveform data memory 10 and the result of comparison of the waveform data stored in waveform data memory 10 with a judgment standard stored in limit line memory 20 at comparison operator 30; and based on the inputted comparison result, waveform data converter 50 converts to a predetermined format only that portion of the waveform data stored in waveform data memory 10 that is judged to be outside the desired range based on the judgment standard; following which waveform display device 40 displays the converted waveform data.

9 Claims, 2 Drawing Sheets

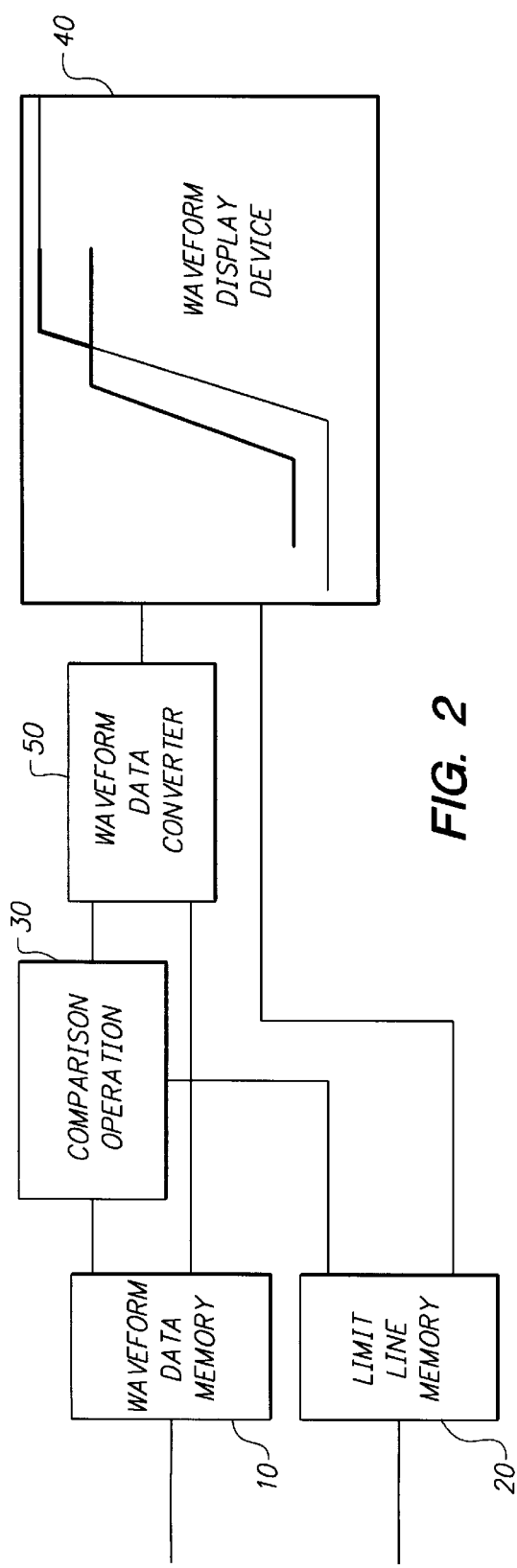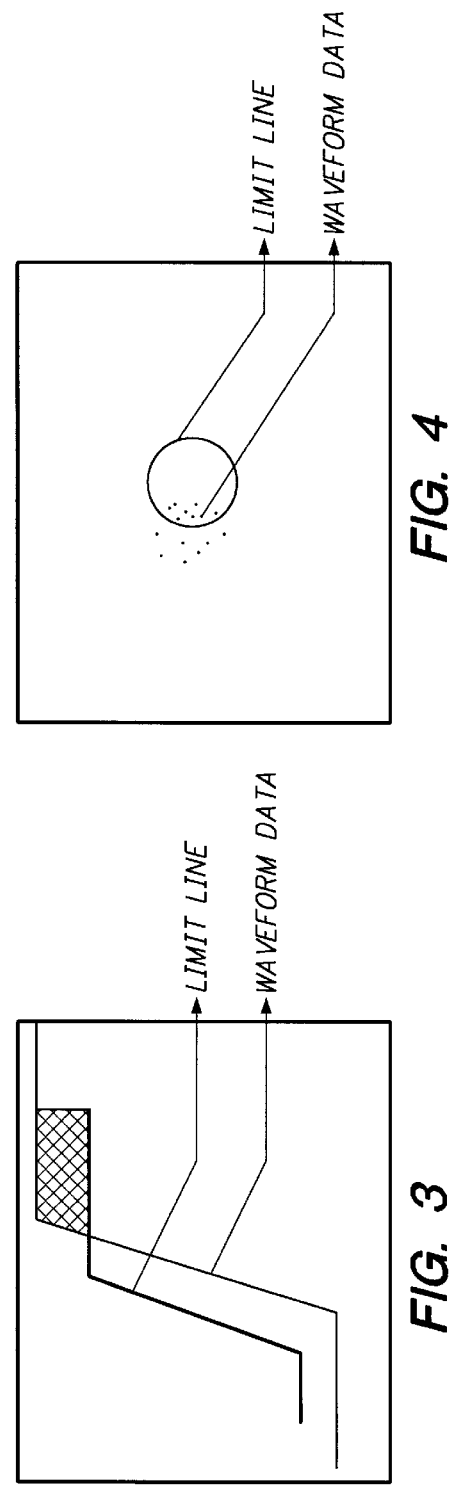

//METHOD AND SYSTEM FOR ANALYZING AND DISPLAYING WAVEFORM DATA

BACKGROUND OF THE INVENTION

1. Field of the Invention

The present invention relates to a waveform analyzer, and particularly to a display method that enables easy recognition of judgment results of waveform data in a waveform analyzer.

2. Description of the Related Art

FIG. 1 is a block diagram showing one example of the construction of a waveform analyzer of the prior art.

As shown in FIG. 1, the prior-art example is composed of waveform data memory 10 in which data inputted from the outside are stored, limit line memory 20 in which is stored limit line information that serves as a judgment standard for judging whether a displayed waveform is within a desired range or outside the range, comparison operator 30 that compares waveform data stored in waveform data memory 10 and information stored in limit line memory 20 and outputs the result of comparison, memory 60 in which the result of comparison outputted from comparison operator 30 is stored, and a waveform display device 40 that displays waveform data stored in waveform data memory 10, information stored in limit line memory 20, and the comparison result stored in memory 60.

Regarding the operation of the waveform analyzer configured according to the foregoing description, waveform data stored in waveform data memory 10 and information stored in limit line memory 20 are first inputted to comparison operator 30, whereupon the waveform data stored in waveform memory 10 are compared with the information stored in limit line memory 20 at comparison operator 30, and a comparison result is outputted.

At comparison operator 30, the waveform data stored in waveform data memory 10 are compared with the information stored in limit line memory 20 using the limit lines stored in limit line memory 20 to determine whether the waveform data stored in waveform memory 10 are within a desired range or outside the range.

Waveform display device 40 then displays both the waveform data stored in waveform data memory 10 and information stored in limit line memory 20, and in addition, displays by means of characters the comparison results in comparison operator 30 inputted by way of memory 60.

In the above-described waveform analyzer of the prior art, the results of comparing the waveform data stored in the waveform data memory and information stored in the limit line memory in the comparison operator are displayed on the waveform display device only by means of characters, and as a consequence, there is the problem that information relating to a failure in the waveform data cannot be easily recognized.

SUMMARY OF THE INVENTION

The object of the present invention is to provide a waveform analysis method and waveform analyzer that enable recognition at a glance whether or not displayed waveform data fall within a desired range.

To achieve the above-described object, the present invention is characterized by comparing waveform data inputted from the outside with a judgment standard for judging whether or not the waveform data are within a desired range, converting the waveform data to a predetermined form based on the result of comparison, and displaying the converted waveform data and the judgment standard.

The present invention is characterized by comprising: a first memory means that stores waveform data inputted from the outside; a second memory means that stores a judgment standard for judging whether or not the waveform data are within a desired range; a comparison means that compares the waveform data with the judgment standard and outputs a comparison result; a conversion means that inputs the waveform data and the comparison results, converts the waveform data to a predetermined form based on the inputted comparison results, and outputs the result; and display means that displays the waveform data converted at the conversion means and the judgment standard.

The above-described conversion means may be further characterized by converting the color of that portion of the waveform data stored in the first memory means that lies outside the desired range and outputting the result.

The above-described conversion means may be further characterized by converting the type of line of that portion of the waveform data stored in the first memory means that lies outside the desired range and outputting the result.

The above-described conversion means may be further characterized by converting the line width of that portion of the waveform data stored in the first memory means that lies outside the desired range and outputting the result.

In the present invention constructed according to the foregoing description, waveform data stored in the first memory means and the results of comparison performed in the comparison means of waveform data stored in the first memory means and a judgment standard stored in the second memory means are inputted to the conversion means; and in the conversion means, based on the inputted comparison results, only that portion of the waveform data stored in the first memory means that is judged to be outside the desired range based on the judgment standard is converted to the predetermined form; and in the display means, the converted waveform data are displayed, thereby allowing recognition of failure information of the waveform data by a simple glance at the displayed waveform data.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 2 is a block diagram showing an embodiment of the waveform analyzer of the present invention.

FIG. 3 shows another embodiment of the displayed form in the waveform analyzer of the present invention.

FIG. 4 shows another embodiment of the displayed form in the waveform analyzer of the present invention.

DETAILED DESCRIPTION OF THE PREFERRED EMBODIMENTS

Figure 1:
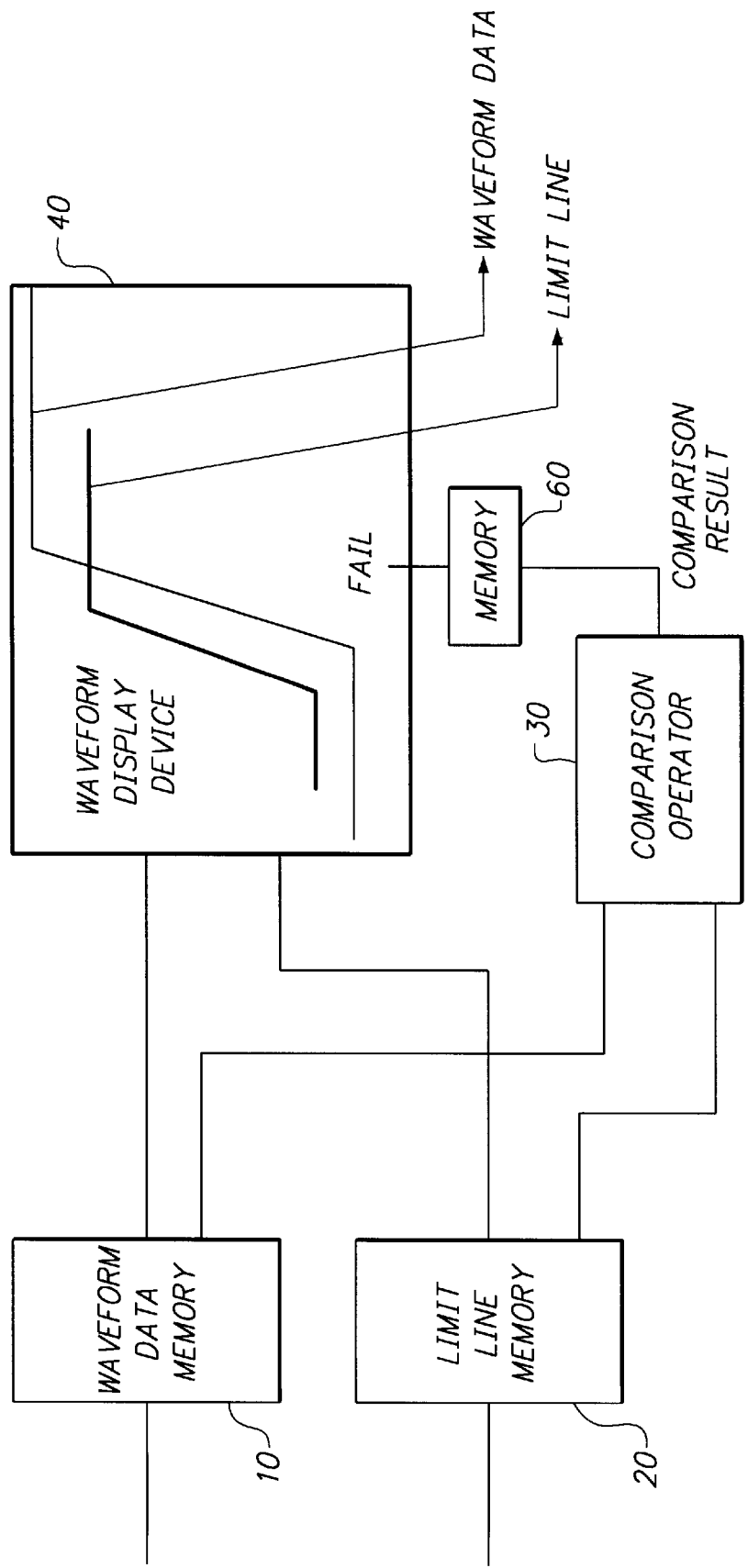
FIG. 1 is a block diagram showing one example of a waveform analyzer of the prior art.

Embodiments of the present invention will next be described with reference to the accompanying figures.

FIG. 2 is a block diagram showing one embodiment of the waveform analyzer of the present invention.

As shown in FIG. 2, the present embodiment is composed of waveform data memory 10 which is the first memory means in which waveform data inputted from the outside are stored; limit line memory 20 which is the second memory means in which is stored limit line information that serves as a judgment standard for determining whether a displayed waveform is within the desired range or outside the range; comparison operator 30 which is the comparison means that compares the waveform data stored in the waveform data memory 10 with the information stored in the limit line memory 20 and outputs the result of comparison; waveform data converter 50 which is the conversion means that inputs the waveform data stored in the waveform data memory 10 and the comparison result in comparison operator 30, and based on the inputted comparison result, converts to a prescribed form only that portion of the inputted waveform data that is outside the desired range and outputs the waveform data; and waveform display device 40 which is the display means that displays the waveform data outputted from waveform data converter 50 and the information stored in limit line memory 20.

Regarding the operation of a waveform analyzer constructed according to the foregoing description, waveform data stored in waveform data memory 10 and limit line information stored in limit line memory 20 are first inputted to comparison operator 30, whereupon the waveform data stored in waveform data memory 10 and the limit line information stored in the limit line memory 20 are compared at comparison operator 30, and the results of comparison are outputted.

Here, waveform data stored in waveform data memory 10 and the information stored in limit line memory 20 are compared in comparison operator 30 by determining whether the waveform data stored in waveform data memory 10 are within a desired range or outside the range based on limit line information stored in limit line memory 20.

Next, the waveform data stored in waveform data memory 10 and the result of comparison in comparison operator 30 are inputted to waveform data converter 50, and in waveform data converter 50, based on the inputted comparison result, only the fail portion of the inputted waveform data that falls outside the desired range are converted to the prescribed form, following which the converted waveform data are outputted.

The conversion of waveform data in waveform data converter 50 consists in altering one or a plurality of display formats such as the line color, line type, and line width.

Finally, the information stored in limit line memory 20 is displayed in waveform display device 40, and in addition, the waveform data stored in waveform data memory 10 are displayed with only the fail portion displayed in an altered display format.

Another Embodiment

FIG. 3 shows another embodiment of the display format of the waveform analyzer of the present invention in which the limit line is in an open loop form and the waveform data is continuous. As shown in FIG. 3, the area formed between the fail portion of the waveform data and the limit line may be filled in to highlight the fail portion.

FIG. 4 shows yet another embodiment of the display format of the waveform analyzer of the present invention in which the limit line is in closed loop form and the waveform data are scattered values.

In the present invention as described in the foregoing explanation, a conversion means is provided that, based on the result of comparison by the comparison means of waveform data stored in the first memory means and a judgment standard stored in the second memory means, converts to a predetermined format only that portion of the waveform data stored in a first memory means that is judged to be outside a desired range based on the judgment standard and outputs the waveform data; and these waveform data are displayed on the display means with only the fail portion converted, whereby the fail information of the waveform data can be readily identified by merely glancing at the displayed waveform data.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A waveform analysis method comprising the step of:

comparing waveform data with a judgment standard to judge whether or not said waveform data are within a desired range; and converting said waveform data to a predetermined form based on results of said comparison so as to highlight at least one portion of the waveform data which lies outside said desired range, and displaying the converted waveform data and said judgment standard.

2. A waveform analyzer comprising:

a first memory means for storing inputted waveform data;

a second memory means for storing a judgment standard for judging whether or not said waveform data are within a desired range;

a comparison means for comparing said waveform data with said judgment standard and outputting a comparison result;

a conversion means for receiving said waveform data and said comparison result, converting said waveform data to a predetermined form based on the received comparison result so as to highlight at least one portion of said waveform data which lies outside said desired range, and outputting the result of said conversion; and display means for displaying waveform data converted by said conversion means and said judgment standard.

3. A waveform analyzer according to claim 2 wherein said conversion means comprises means for converting the color of that portion of said waveform data stored in said first memory means that lies outside said desired range to another color and outputting the result of conversion.

4. A waveform analyzer according to claim 2 wherein said conversion means comprises means for converting the type of line of that portion of said waveform data stored in said first memory means that lies outside said desired range to another type of line and outputting the result of conversion.

5. A waveform analyzer according to claim 3 wherein said conversion means comprises means for converting the type of line of that portion of said waveform data stored in said first memory means that lies outside said desired range to another type of line and outputting the result of conversion.

6. A waveform analyzer according to claim 2 wherein said conversion means comprises means for converting the line width of that portion of said waveform data stored in said first memory means that lies outside said desired range to another line width and outputting the result of conversion.

7. A waveform analyzer according to claim 3 wherein said conversion means comprises means for converting the line width of that portion of said waveform data stored in said first memory means that lies outside said desired range to another line width and outputting the result of conversion.

8. A waveform analyzer according to claim 4 wherein said conversion means comprises means for converting the line width of that portion of said waveform data stored in said first memory means that lies outside said desired range to another line width and outputting the result of conversion.

9. A waveform analyzer according to claim 5 wherein said conversion means comprises means for converting the line width of that portion of said waveform data stored in said first memory means that lies outside said desired range to another line width and outputting the result of conversion.

* * * * *